United States Patent [19]
Lee et al.

[11] Patent Number: 5,747,985
[45] Date of Patent: May 5, 1998

[54] OPTICAL-ELECTRONIC DEMAND METER USING OPTICAL METERING OUTFIT

[75] Inventors: Won-Bin Lee, Seoul; Hong-Keun Cho, Taejeon; Chung-Moo Song, Seoul; Yo-Hee Kim, Kyunggi-Do; Young-Soo Kim, Kyungaangnam-Do, all of Rep. of Korea

[73] Assignee: Korea Electric Power Corporation, Seoul, Rep. of Korea

[21] Appl. No.: 670,423

[22] Filed: Jun. 26, 1996

[30] Foreign Application Priority Data

Nov. 10, 1995 [KR] Rep. of Korea .............. 95-45770

[51] Int. Cl.[6] .................. G01R 11/63; G01R 31/00
[52] U.S. Cl. ..................... 324/103 R; 324/96
[58] Field of Search .............. 324/103 R, 156, 324/157, 96, 244.1, 107, 141, 142; 364/483

[56] References Cited

U.S. PATENT DOCUMENTS

| | | | |
|---|---|---|---|
| 4,491,793 | 1/1985 | Germer | 324/157 |
| 4,584,523 | 4/1986 | Elabd | 324/96 |
| 5,057,767 | 10/1991 | Keturakis et al. | 324/156 |
| 5,471,137 | 11/1995 | Briese et al. | 324/158.1 |
| 5,471,139 | 11/1995 | Zadoff | 324/244.1 |

*Primary Examiner*—Ernest F. Karlsen
*Assistant Examiner*—Anh Phung
*Attorney, Agent, or Firm*—Watson Cole Stevens Davis, PLLC

[57] ABSTRACT

An optical-electronic demand meter using an optical metering outfit (MOF) is disclosed. The optical-electronic demand meter includes: a light emitting device driving circuit for sending light rays through an optical fiber to an exclusive optical MOF; a light receiving device driving circuit for receiving optical voltage and current signals as modulated optical signals from the optical MOF so as to convert them into electrical signals; a zero point adjusting circuit for adjusting the zero point of the converted electrical voltage and current signals; a multiplying circuit for multiplying the output voltage and current signals so as to form power signals; an active/reactive power separating circuit for separating the power signals into active power signals and reactive power signals; a power summing circuit; an effective value converting circuit for converting the absolute values of power into effective values; a voltage/frequency converting circuit for generating pulses of frequencies corresponding to the output of the effective value; an integrating and displaying circuit 90 for calculating and integrating the pulse signals, and for storing and displaying the integrated data; and a power source circuit. In the demand meter, there is not required a separate insulating device, and the demand meter is capable of carrying out reliable arithmetic operations and integrations for the proper amount.

6 Claims, 9 Drawing Sheets

10

5,747,985

OPTICAL-ELECTRONIC DEMAND METER USING OPTICAL METERING OUTFIT

BACKGROUND OF THE INVENTION

1. Field of the Invention

The present invention relates to an optical-electronic demand meter (to be referred to "DM" below) using an optical metering outfit. In particular, the present invention relates to an optical-electronic demand meter in which an optical current transformer (to be referred to "CT" below) and an optical potential transformer (to be referred to "PT" below) are used so as to form an optical metering outfit having no separate insulating device, and receiving no influence of noise and other surges, thereby making it possible to carry out arithmetic, multiplication and other operations in a reliable manner.

2. Description of the Prior Art

Generally, the metering outfit which is currently used for detecting current and voltage requires a separate insulation in accordance with the magnitude of the system voltage, with the result that separate insulating expense is required. Further, its weight is increased, and in the case where noise and other surges intrude from the external, it has no immunological function.

Further, in the case of the conventional metering outfit, an iron core is used, and therefore, the wave patterns are distorted due to the magnetic saturation. Further, due to a harmonic resonance phenomenon, measuring errors can occur.

SUMMARY OF THE INVENTION

The present invention is intended to overcome the above described disadvantages of the conventional technique.

Therefore it is the object of the present invention to provide an optical-electronic demand meter in which an optical current transformer and an optical potential transformer with a primary side and a secondary side completely separated from each other are employed, so that a separate insulating device would not be required, and that it would not be influenced by noise and various surges.

In achieving the above object, the present invention is characterized in that an optical metering outfit employing the already developed optical CT and optical PT is connected through an optical fiber to the optical-electronic DM of the present invention. Further, light rays emitted from a light emitting device are sent through an optical fiber to the optical metering outfit (to be referred to "MOF" below). Then the light rays are modulated by the optical MOF, and are received through an optical fiber to a light receiving device. Then the modulated optical light rays are converted to electrical signals by a light receiving circuit. Then zero points are adjusted for the converted current and voltage signals, and then, the voltage and current signals are multiplied to form power signals. For the power signals, active power signal components and reactive power signals components are separated from each other. Then the active components and the reactive components are added up respectively, thereby obtaining the final active power amount and the reactive power amount for the power used. The calculated active power amount and the reactive power amount are respectively classified into days, evenings and midnights so as to display them in added-up amounts by the classified hours.

In order to safely keep the above described data even during a power failure, a power source circuit having an auxiliary battery is provided, so that about 15 seconds can be ensured for storing the data during a power failure.

Further, during a power failure, various power data are stored into an EEPROM, and when the power supply is restored, the stored data are loaded in an automatic manner, so that the multiplication operation can be resumed.

Therefore, according to the present invention, the arithmetic calculations, integrations and other operations can be conveniently carried out and displayed without being influenced by noise and other various surges.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1:
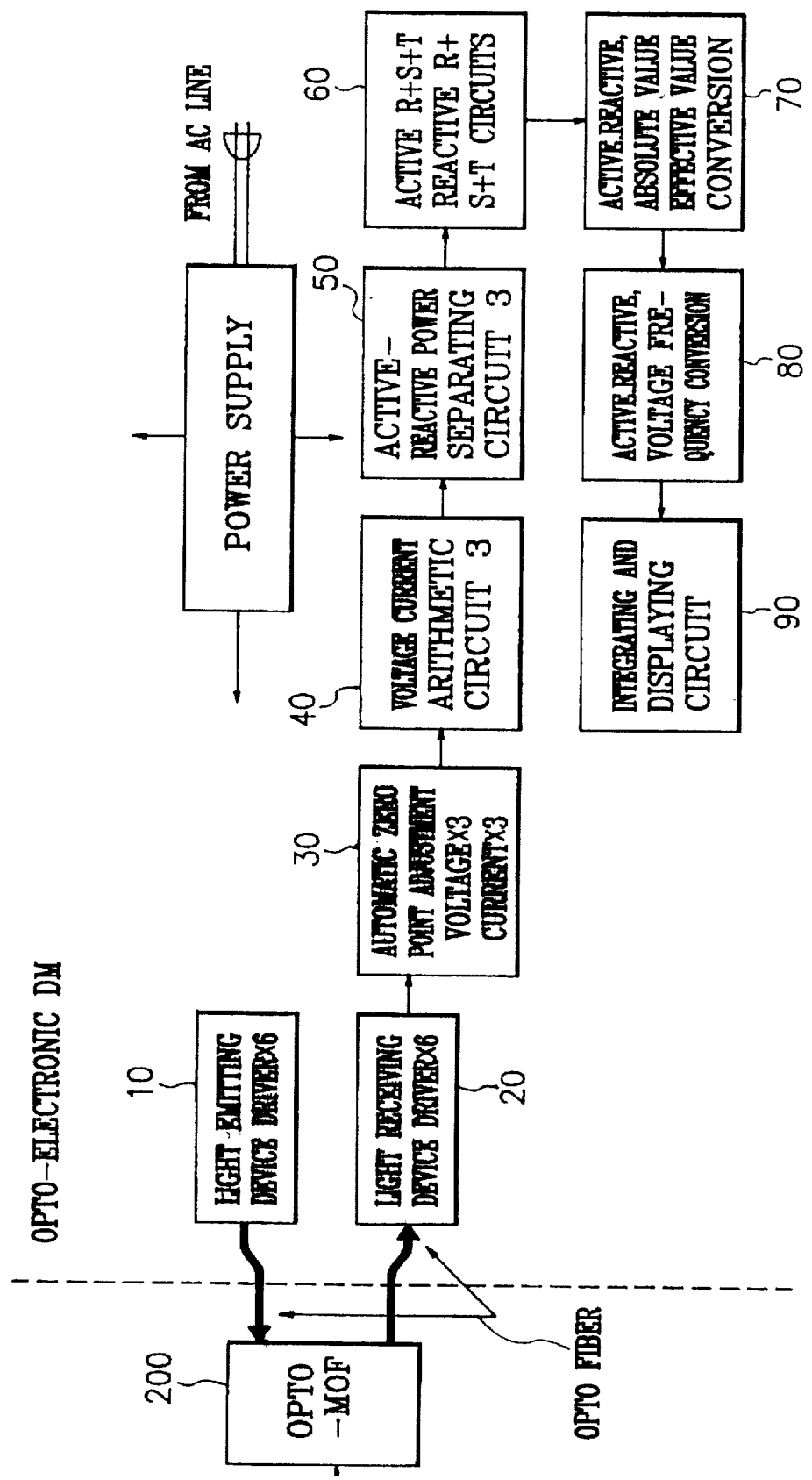
FIG. 1 is a block diagram showing the constitution of the optical-electronic demand meter according to the present invention.

FIG. 1 is a block diagram showing the constitution of the optical-electronic demand meter according to the present invention.

The optical-electronic demand meter according to the present invention includes: a light emitting device driving circuit 10 for driving a light emitting device, the light emitting device sending light rays through an optical fiber to an already developed optical metering outfit 200; a light receiving device and a light receiving circuit 20 for receiving optical voltage and current signals as modulated optical signals from the MOF 200 through an optical fiber so as to convert them into electrical signals; a zero point adjusting circuit 30 for adjusting the converted electrical voltage and current signals of the light receiving circuit 20 so as to make the central point of the wave positioned at an electrical zero point; a multiplying circuit 40 for multiplying the output voltage and current signals of the zero point adjusting circuit 30 so as to form power signals; an active/reactive power separating circuit 50 for separating the power signals of the multiplying circuit 40 into active power signals and reactive power signals; a power summing circuit 60 for summing up the active power and the reactive power of the active/reactive power separating circuit 50 for respective phases; an effective value converting circuit 70 for converting the absolute values of the active power and the reactive power of the power summing circuit 60 into effective values; a voltage/frequency converting circuit 80 for generating pulses of frequencies corresponding to the output of the effective value converting circuit 70; an integrating and displaying circuit 90 for calculating and integrating the pulse signals of the voltage/frequency converting circuit 80, and for storing and displaying the integrated data; and a power source circuit 100 for supplying power to the above mentioned circuits, and including a battery backup circuit for ensuring an operation time for storing the data during a power failure.

The optical MOF 200 includes an optical CT and an optical PT with their primary sides and secondary sides separated from each other. Between the optical MOF 200 and the optical-electronic DM, there are connected four optical fibers for each set of the optical MOF 200. The light rays which started from an optical source of the DM arrives at the optical CT and the optical PT of the optical MOF respectively. Then the light rays undergo a modulating procedure by the optical CT and by the optical PT based on the current and voltage. Then the modulated light rays arrive through the respective optical fibers to the light receiving device of the DM.

As the power system is 3-phase, the light emitting device and its driving circuit 10 include a total of 6 optical sources and driving circuits consisting of 3 for the voltage and 3 for the current. The light receiving device and its driving circuit 20 also include a total of 6 light receiving devices and driving circuits consisting of 3 for the voltage and 3 for the current.

That is, the light emitting device driving circuit 10 is designed to be capable of emitting a certain amount of light rays, and the same circuits are provided in a quantity of 6.

Meanwhile, when the modulated light rays are irradiated from the optical MOF 200 through the optical fibers to the light receiving device, the light receiving device driving circuit 20 carries out modulations again with power intensities in accordance with amounts of the incident light rays. In order to raise the input resistance, to achieve a low noise differential amplification, and to reduce the influence of the temperature variation, there is used a dual field effect transistor (FET) 20 in which two FETs Q21 and Q22 are included. Further, an OP amplifier (OP AMP) U20 carries out a differential amplification, so that electrical signals can be outputted proportionally to the amounts of light rays. This light receiving device driving circuit 20 includes also 6 same circuits.

The adjustment of the zero point by the DM denotes as follows. That is, ac sinusoidal waves are varied alternately to the positive side and to the negative side across the zero point, but owing to the bending of the cable, the sinusoidal waves are biased toward the positive side or toward the negative side. In order to overcome this phenomenon, the central point of the signal wave is automatically adjusted to the zero point.

The automatic zero point adjusting circuit 30 includes: a pre-amplifying section 31 for amplifying the output signals of the light receiving circuit 20; a filter 32 for stabilizing the amplified signals, and for removing harmonic noises; a dc signal detecting section 33 for integrating the signals of the filter 32, and for detecting dc components; an ac signal detecting section 34 for differentiating the signals of the filter 32 so as to remove dc components and to detect only ac components; a zero point arithmetic IC U32 for dividing an ac signal portion by a dc signal portion so as to obtain ac signals always alternating across the zero potential regardless of the magnitude of the dc portion; and an amplifying and outputting section 36 for amplifying and filtering the output signals of the zero point arithmetic IC U32 before outputting them.

Meanwhile, the (voltage)×(current) arithmetic circuit 40 includes an arithmetic-only IC U40. In the sinusoidal waves of voltage and current, the signal waves are subjected to an arithmetic operation, and the output takes the form of signal waves in which the voltage and current are multiplied.

In the case where voltage and current are subjected to an arithmetic operation in a state of signal waves, and where the result of the arithmetic operation is obtained in the form of signals waves rather than a dc current, the zero point of the signal waves is biased to the positive or negative side due to the phase difference between the voltage and current. If the phase difference between voltage and current is 0, that is, if they have the same phase, the signal waves are formed only on the positive side. If the phase of current leads or lags the voltage, then the signal waves are biased to the negative side proportionally to the phase difference.

In this context, the portion which is biased to the positive side across the 0 point corresponds to the active power, while the portion which is biased to the negative side across the zero point corresponds to the reactive power. Therefore, the active/reactive power separating circuits 50 are provided in three sets, and each set consists of an active power separating section 51 and a reactive power separating section 52, so that the signal waves can be separated so as to output signal waves alternating across the 0 potential.

Further, the active power and the reactive power are obtained for the respective phases, and therefore, the summing circuit 60 includes: summing sections 61A and 61R for summing up the R, S, and T states of the active power and the reactive power; and first and second amplifying sections 62A, 63A, 62R and 63R.

The effective value converting circuit 70 converts the respective signal waves of the active power and the reactive power to dc signals as much as the effective value of the waves.

The constitutions of the effective value converting circuits 70 for the active power and the reactive power are same with each other, and therefore, the circuits 70 are provided in the number of two.

The voltage/frequency converting circuit 80 converts the converted dc signals (converted into the effective values) to a pulses series corresponding to the dc voltages so as to integrate them. First a conversion is carried out to a high frequency, and then, a frequency division is carried out to obtain a proper number of pulses.

When transferring the pulses within the circuit, an insulation is formed. For this purpose, a photo coupler is used for optically insulating the pulse transfer process. Further, in order to process the active and reactive powers, the circuits 80 is provided in two sets.

In the power source circuit, a transformer is used to step down the supply voltage, and rectification and stabilization are carried out, thereby obtaining a positive dc power source. Further, a constant voltage IC is used to obtain a constant voltage. The power is supplied through a dc/dc converter, for making the power source of the respective arithmetic circuits (which are an integrating digital portion and an analogue portion) independent, and for making the insulating strength of the power source higher. In order to maintain an operating power for momentarily storing the data during a power failure, a small battery and a charge/discharge circuit are provided.

The integration and display are controlled by four sets of LCDs and a CPU, and an exclusive CPU is used so that the number of pulses, the integration and various time setting through key inputs would be possible.

As to the storing of data, the data which are recorded into an EEPROM are permanently preserved even without supplying a separate power source.

Figure 2:
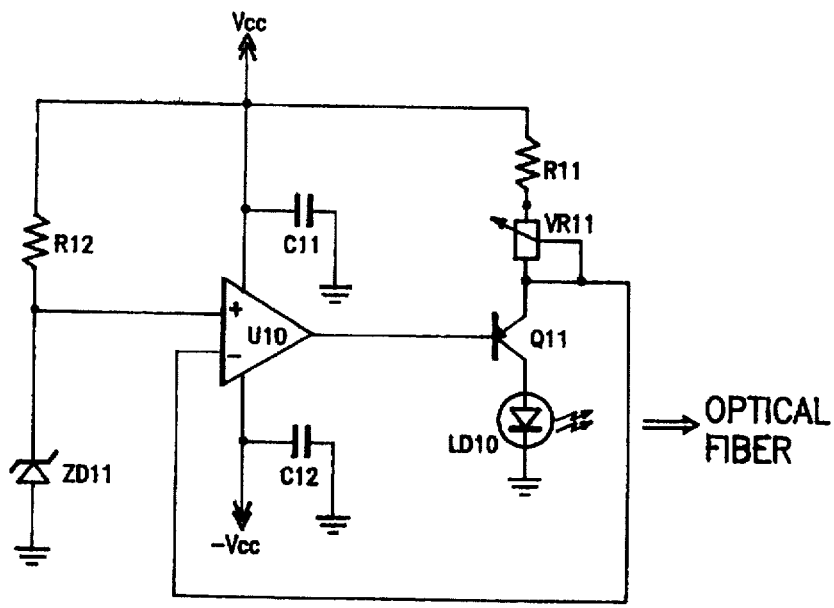
FIG. 2 illustrates a light emitting device driving circuit.

FIG. 2 illustrates a light emitting device driving circuit of the optical-electronic DM according to the present invention, for transmitting light rays to the optical MOF.

A power source Vcc of +12 V is supplied through a resistor R12, and if a stable reference voltage is formed by a zener diode ZD11, this stable voltage is supplied to a non-inverting terminal of the OP amplifier U10.

The output of the OP amplifier U10 is supplied to the base of a optical source driving transistor Q11, and a potential of +12 V passes through a resistor R11 and a variable resistor VR11 so as to be supplied through the emitter-collector of the transistor Q11 to the anode of an optical source LD10. The cathode of the optical source LD10 is connected to the zero potential, and therefore, the optical source LD10 outputs light rays.

Under this condition, voltage signals which are proportional to the current detected at the emitter of a transistor Q11 is connected to a non-inverting terminal of the OP amplifier U10, so that a rectifying circuit would be formed. Therefore, the electric current flowing through the optical source LD10 becomes constant. Thus, the amount of the light rays which are outputted from the optical source LD10 becomes constant.

Under this condition, if the resistance of the variable resistor VR11 is adjusted, the electric current flowing through the optical source LD10 is varied, thereby making it possible to set the light amount. Further, capacitors C11 and C12 are connected to the power source terminal, and therefore, the power source noise is eliminated as well as stabilizing the current.

Figure 3:
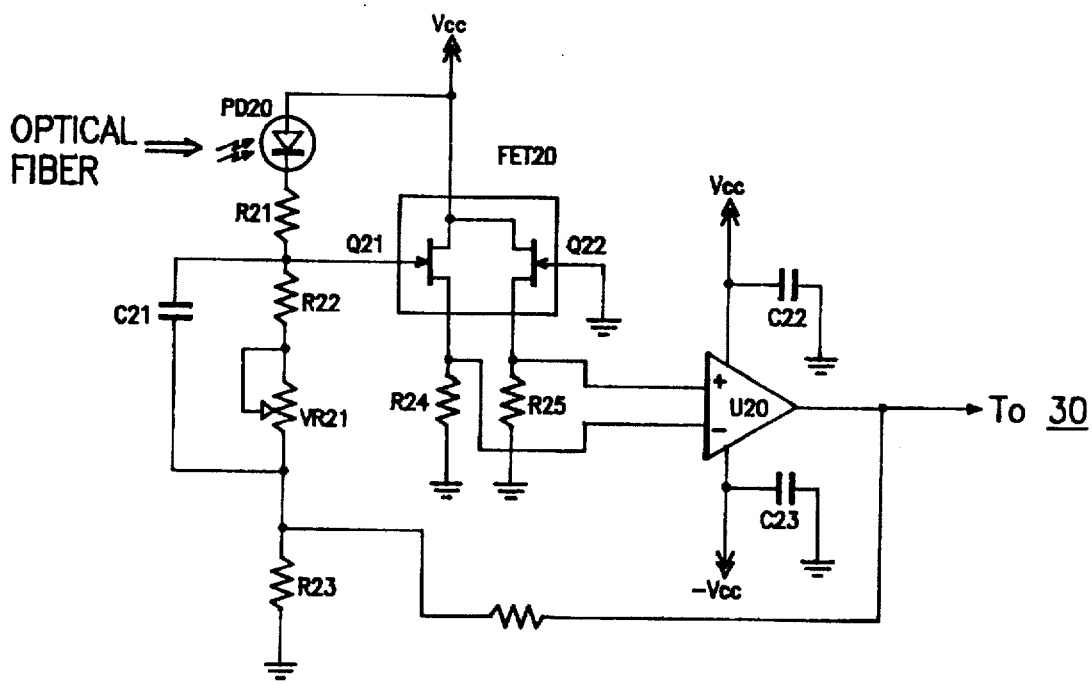
FIG. 3 illustrates a light receiving device driving circuit.

FIG. 3 illustrates the light receiving device driving circuit of the optical-electronic DM according to the present invention, the circuit receiving modulated light rays from the optical MOF.

A power source of +12 V is supplied to the anode of a light receiving device PD20, and a connection is formed from the cathode of the light receiving device PD20 through a resistors R21, R22, VR21 and R23 to the ground. The electric current flowing through the light receiving device PD20, which is proportional to the light rays incident to the light receiving device PD20, flows from the power source +12 V through the light receiving device PD20 and the resistors R21, R22, VR21 and R23 in a sequential order.

By adjusting the variable resistor VR21, the current flow can be varied, and this is similar to the adjustment of the bias in the circuit.

The voltage value which is proportional to the current flowing through the light receiving device PD20 is generated at a connection point between the resistors R21 and R22. This potential is supplied to the gate of a transistor Q21 which is a component member of a dual field effect transistor FET20.

The drain of the transistor Q21 is connected to the power source of +12 V, while its source electrode is connected through a resistor R24 to the ground.

Under this condition, in accordance with the level of the potential which is supplied to the gate of the transistor Q21, an electric current flows from the drain of the transistor Q21 through its source and a resistor R24 to the ground. There exists a potential between the resistor R24 and the drain correspondingly with the flowing current.

This potential is connected to an inverting input terminal of an OP amplifier U20. The drain of a transistor Q22 is connected to the power source +12V, and its source is connected through a resistor R25 to the ground.

However, the gate of the transistor Q22 is connected to the ground, and therefore, there flows no current between the drain and source of the transistor Q22, but an extremely weak current flows owing to the variation of temperature.

The potential which is proportional to this current appears also at a connection point between the resistor R25 and the source of the transistor Q22. This potential is connected to a non-inverting input terminal of the OP amplifier U20.

Thus the OP amplifier U20 carries out a differential amplification so as to output voltages in accordance with the amount of light rays incident to the light receiving device.

Further, the connection point between the resistor R23 and the variable resistor VR21, which is the path of the current flow between the OP amplifier U20 and the light receiving device PD20, is connected through a resistor R26, so that a part of the output is fed back so as for a small amount to be supplied to the input side.

Between the connection points between the resistors R21 and R22 and between the resistors VR21 and R23, there is connected a capacitor C21, and through this capacitor C21, signal components flow, as well as damping the noises.

Capacitors C22 and C23 are connected to the power supply terminals of the OP amplifier U20 so as to absorb noises and to stabilize the power source voltage.

Figure 4:
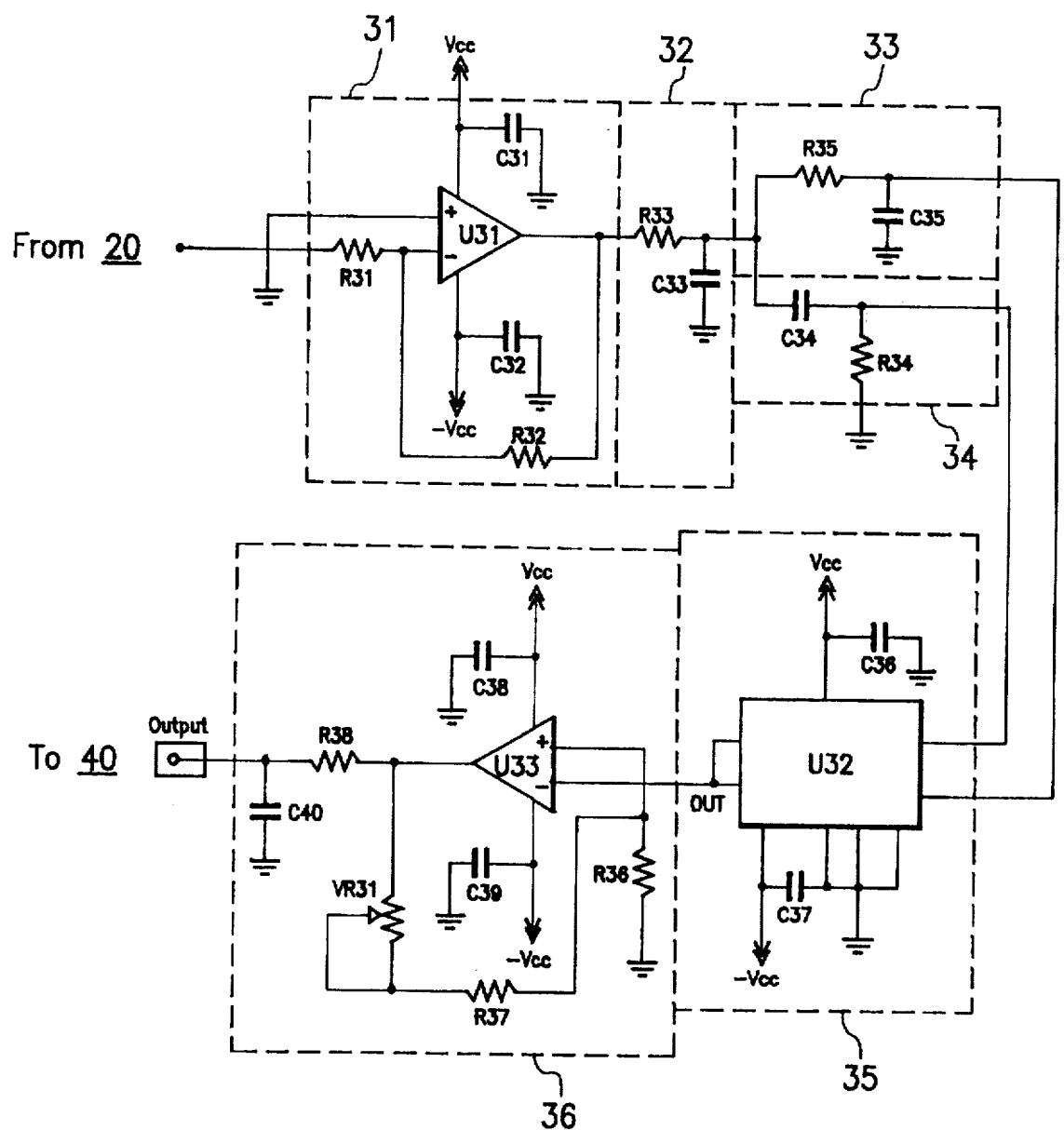
FIG. 4 illustrates a zero point automatic adjusting circuit.

FIG. 4 illustrates the automatic zero point adjusting circuit for preventing the signal level from being swung to the positive side or to the negative side in the optical-electronic DM according to the present invention.

Signals are supplied through a resistor R31 to an inverting input terminal (−) of an OP amplifier U31. A connection is formed from the output side of the OP amplifier U31 through a resistor R32 to the inverting input terminal (−), while the non-inverting terminal (+) of the OP amplifier U31 is connected to the ground. Thus the OP amplifier U31 functions as an amplifier, and its amplifying rate is varied depending on the ratio of the resistor R31 to the resistor R32. Capacitors C31 and C32 are connected to the power source terminals of the OP amplifier U31, so that noises can be absorbed, and that the power source voltage can be stabilized. Thus the pre-amplification is carried out.

The signals which have been amplified by the OP amplifier U31 are outputted through a resistor R33, and the resistor R33 together with a capacitor C33 functions as a signal stabilizer and as a filter for removing harmonic noises.

The filtered signals pass through a combination of a resistor R34 and a capacitor C34, so that the signal source flows to the ground leaving only the dc component. Through another path, the signals pass through a combination of a capacitor C35 and a resistor R35, so that the dc component flows to the ground leaving only the signal component.

Thus the dc signal component and the ac signal component are separated from each other so as to be supplied to an input terminal of the arithmetic IC U32.

The result of the arithmetic operation is obtained from the output terminal of the arithmetic IC U32 which carries out the calculations based on the following formula.

$$V_{out} = Z2 \text{ (ac component)}/X1 \text{ (dc component)}$$

Thus the obtained result is an ac signal wave pattern which alternates always across the 0 potential regardless of the magnitude of the dc component.

Capacitors C36 and C37 are connected to the power terminals Vcc of the arithmetic IC U32, for eliminating noise and for stabilizing the power.

The signals which have undergone the arithmetic operation are supplied to a non-inverting input terminal (+) of an OP amplifier U33. An inverting input terminal (−) of the OP amplifier U33 is connected through a resistor R36 to the ground. Further, a feedback is done from the output side of the OP amplifier U33 through resistors R37 and VR31 to the inverting terminal (−), so as for the OP amplifier U33 to function as a non-inverting amplifier. The amplification rate is varied in accordance with the resistor R36 and R37+VR31.

Under this condition, the resistor R37 is fixed, and the variable resistor VR31 is varied, thereby adjusting the amplification rate. The output signals are outputted through a resistor R38, and are filtered by a capacitor C40, so that stabilization and harmonic filtering can be carried out. Further, Capacitors C38 and C39 are connected to the power terminal of the OP amplifier U33 so as to absorb the noise and to stabilize the power.

Figure 5:
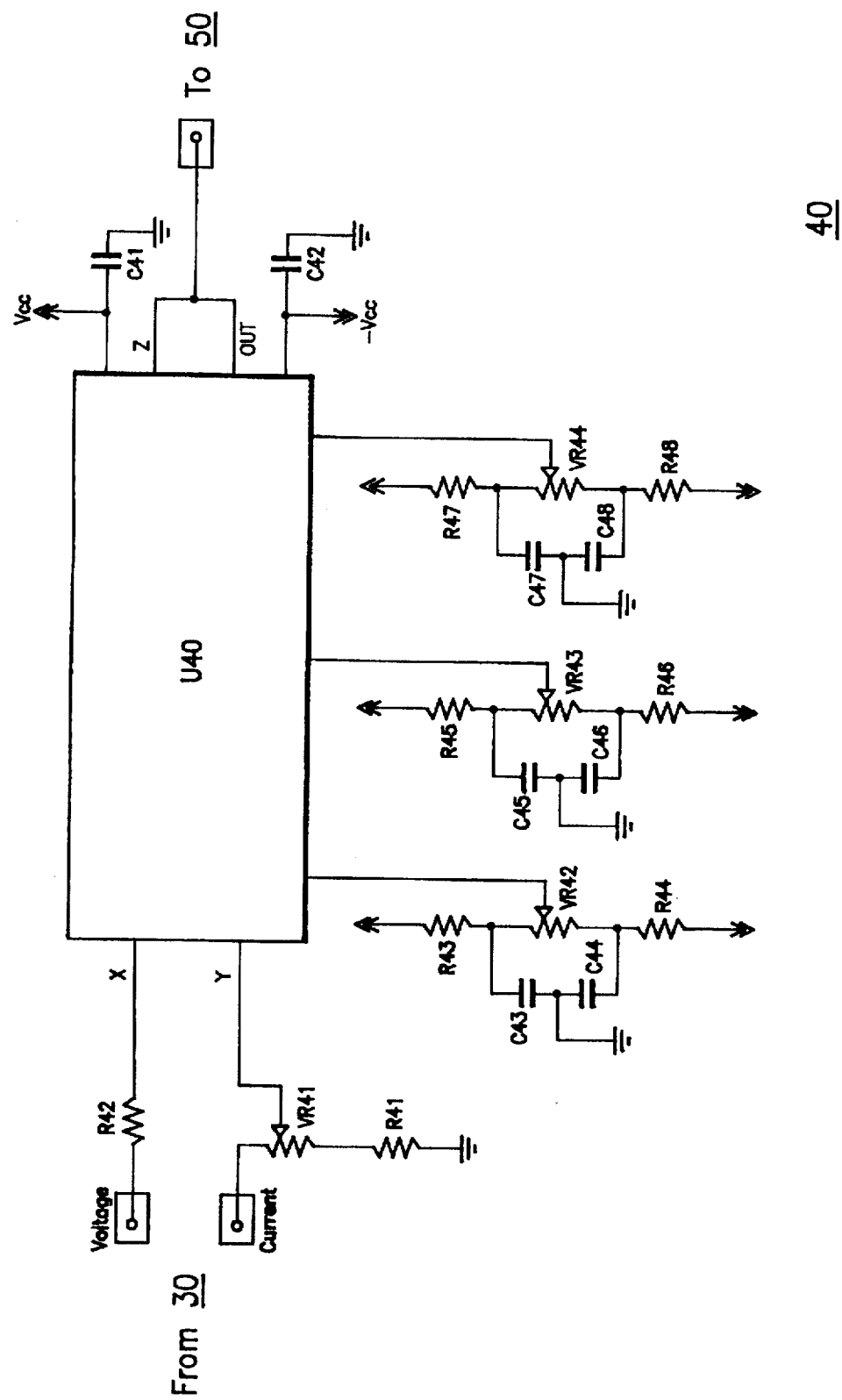
FIG. 5 illustrates a circuit for multiplying the voltages and currents.

FIG. 5 illustrates a voltage-current multiplying circuit of the optical-electronic DM according to the present invention, the circuit calculating the power amount.

The voltage signals which have been outputted from the automatic zero point adjusting circuit 30 are supplied through a resistor R42 to an arithmetic IC U40. The current signals are subjected to a voltage division by a circuit which is connected through resistors R41 and VR41 to the ground. Thus the signals in which the voltage division ratio has been adjusted by varying the variable resistor VR41 are supplied to the arithmetic IC U40. The output level of the arithmetic IC U40 is equivalent to (X voltage)×(Y current).

The arithmetic IC U40 is connected to variable resistors VR42 and VR43, so that the signals supplied to a voltage input terminal and a current input terminal can be adjusted and stabilized. Further, the zero potential during the absence of signals is adjusted by means of a variable resistor VR44.

Further, capacitors C41 and C42 are connected to the power supply terminals of the arithmetic IC 40 so as to absorb the power source noise and to stabilize the power.

Resistors R43, R44 and R45, R46 and R47, R48 are respective voltage divider resistors, respectively including variable resistors VR42, VR43 and VR44.

The arithmetic IC U40 carries out an arithmetic operation directly on the sinusoidal waves of the voltage signals, and its output is also sinusoidal. Accordingly, in the case where there is no phase difference between the incoming two signals, the signals obtained are biased to the positive side, while if the phase difference is increased, so much the signals are biased to the negative side.

Figure 6:
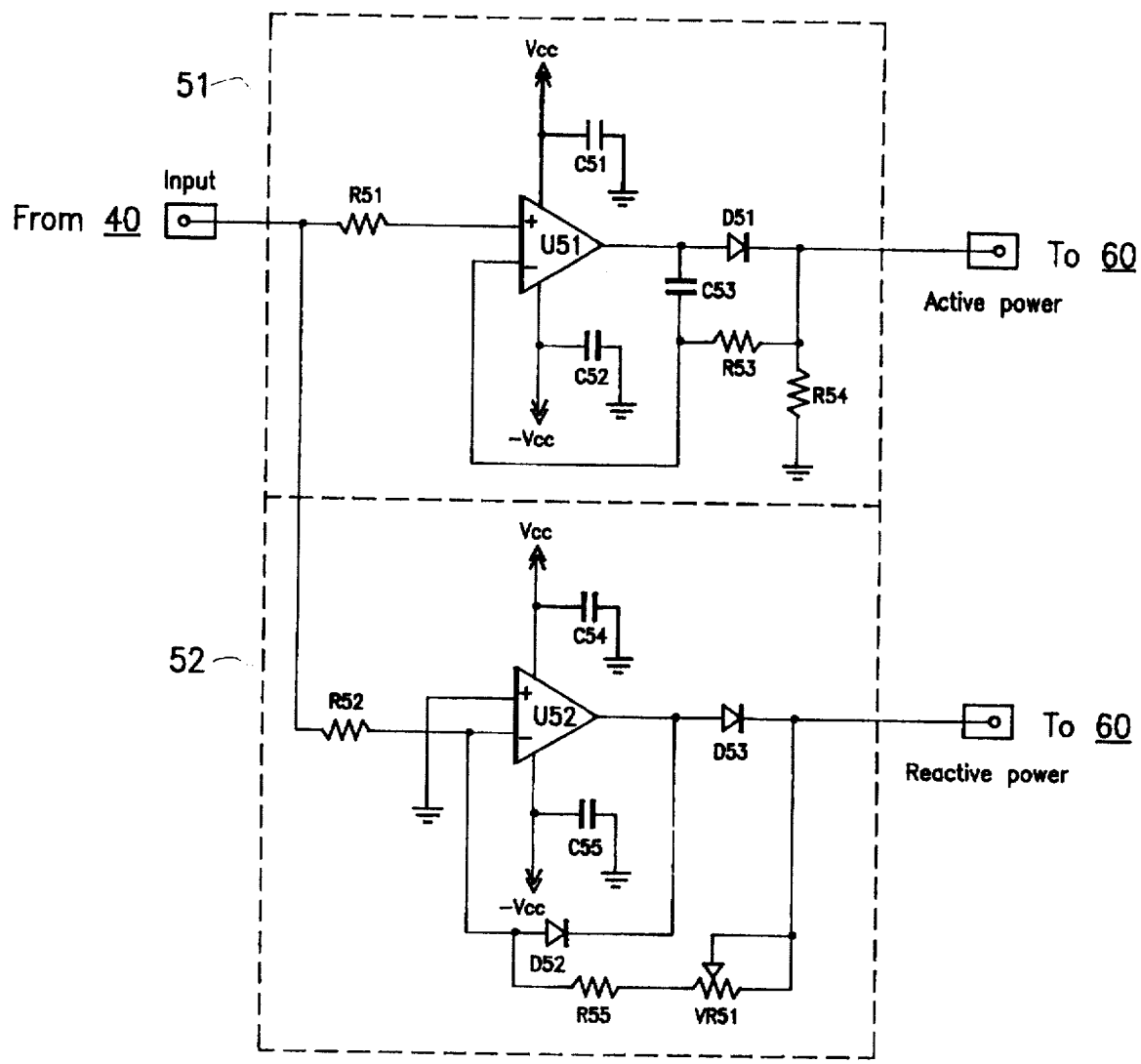
FIG. 6 illustrates a circuit for separating active power and reactive power from each other.

FIG. 6 illustrates an active and reactive power separating circuit of the optical-electronic DM according to the present invention, the circuit separating the active and reactive powers of the total power from each other.

The active/reactive power separating circuit 50 is for separating the active power and the reactive power from each other. The circuit 50 includes: an active power separating section 51 for separating the signals biased to the positive side across the zero point; and a reactive power separating section 52 for separating the signals biased to the negative side across the zero point. Thus the signals biased to the positive side and the signals biased to the negative side are separated from each other.

First an OP amplifier U51 of the active power separating section for obtaining the active power will be described as to its operations.

A diode D51 is installed on a feedback loop of the OP amplifier U51, and thus, the non-linearity is improved by the feedback. The ac characteristics depends on the frequency characteristics of the loop gain of the OP amplifier U51.

There is the prerequisite that the inverting input terminal (−) and the non-inverting input terminal (+) of the OP amplifier U51 have always the same potential. Therefore, when the input voltage is zero, the inverting terminal has to be zero. Therefore, the output of the OP amplifier U51 becomes a forward voltage for the diode D51, with the result that a total balance is achieved.

If +1 V is inputted into the non-inverting terminal (+), the inverting input terminal (−) also has to receive +1 V, and therefore, the output through the diode D51 becomes +1 V.

Thus when a positive voltage is inputted, the output voltage is same as the input voltage.

However, in the case of a negative input voltage, the diode D51 is reverse biased, with the result that the output potential through the diode D51 becomes zero. Further, the output terminal of the OP amplifier U51 is lowered down to the negative supply voltage.

Thus the same voltage is outputted for a positive input, and a switching is provided for a negative input, with the result that only an active power component biased to the positive side is outputted.

Here, a capacitor C53 is used for improving the ac characteristics, and a resistor R51 is installed for stabilizing the input signals. Further, capacitors C51 and C52 are connected for absorbing the power source noise and for stabilizing the power.

Meanwhile, an OP amplifier U52 of the reactive power separating section 52 will be described as to its operations. That is, the input signals are supplied through a resistor R52 to an inverting input terminal of the OP amplifier U52, while its non-inverting input terminal is connected to the ground. Thus the OP amplifier U52 functions as an amplifier in which a feedback is done from the output side to the inverting input terminal.

Here, a diode D53 is a usual diode which carries out a rectifying function, while a diode D52 is for clamping the voltage to about 0.6 V, so that the OP amplifier U52 would not be saturated in the negative direction. Therefore, the OP amplifier U52 does not enter into the saturation region, with the result that its responding speed becomes fast.

Owing to the above described constitution, a negative input is inverted to a positive phase before being outputted. However, a positive input cannot be inverted into a negative phase but is disregarded.

Through such operations, the reactive power biased to the negative side can be separated out.

Figure 7:
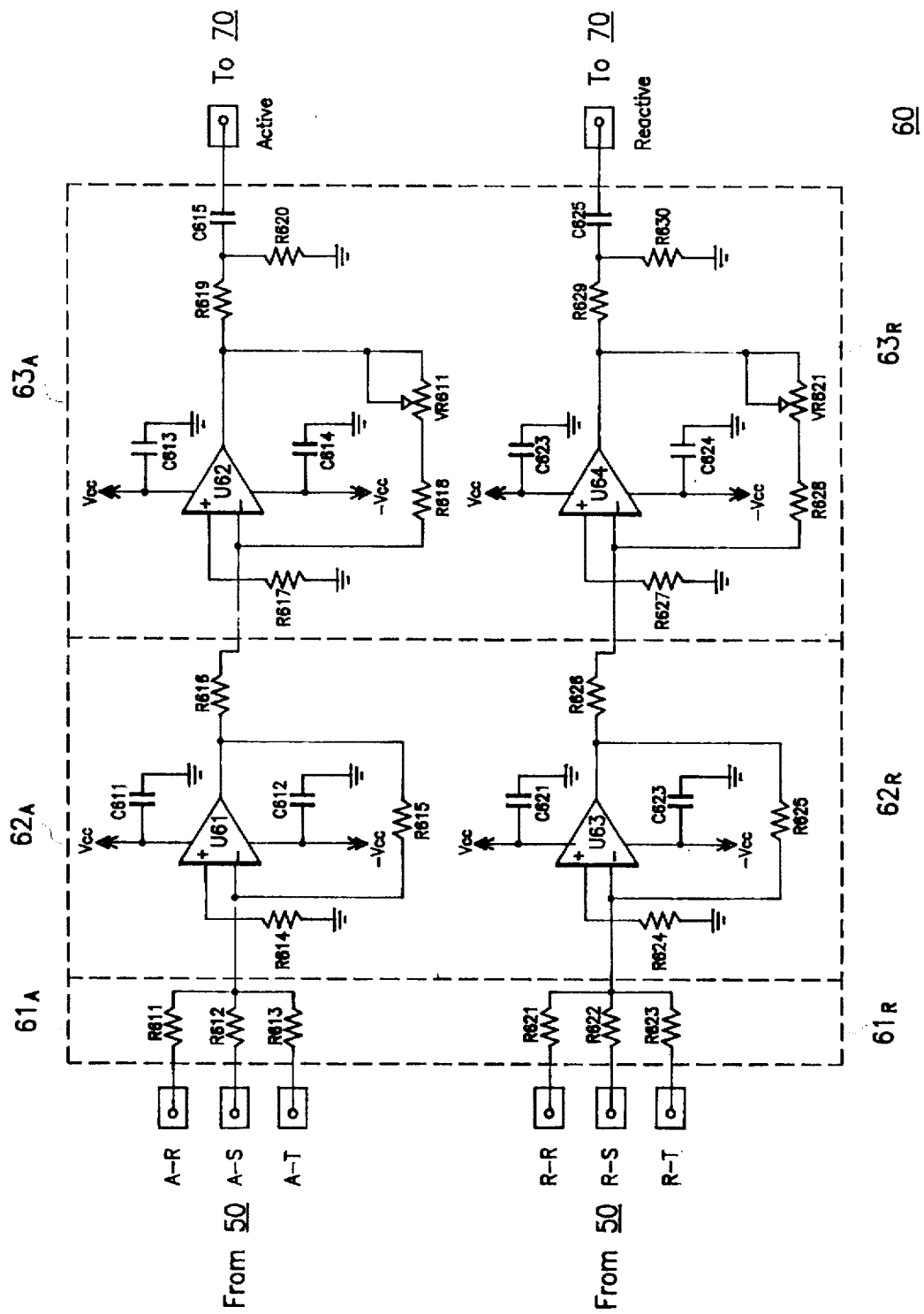
FIG. 7 illustrates a circuit for adding up the active powers and reactive powers for the respective phases.

FIG. 7 illustrates a power summing circuit of the optical-electronic DM according to the present invention, the circuit summing up the active power and the reactive power for the respective phases.

The 3 sets of active signals of R, S and T are supplied through resistors R611, R612 and R613 to a non-inverting terminal of an arithmetic IC U61. The output terminal of the arithmetic IC U61 is connected through a resistor R615 to the inverting input terminal of the arithmetic IC U61, so that the arithmetic IC U61 can serve as an adder.

The non-inverting input terminal of the arithmetic IC U61 is connected through a resistor R614 to the ground, thereby stabilizing the circuit.

Thus the 3-phase active power which have been inputted through the resistors R611, R612 and R613 into the arithmetic IC U61 is summed up, inverted and outputted through its output terminal.

These output signals are supplied through a resistor R616 to a non-inverting terminal of an OP amplifier U62, and the non-inverting terminal of the OP amplifier U62 is connected through a resistor R617 to the ground, so that the circuit would be stabilized. Further, a feedback loop is formed from the output terminal of the OP amplifier U62 through resistors VR611 and R618 to an inverting terminal of the OP amplifier U62, so that U62 would function as an amplifier. Further, by varying the VR611, the amplifying level is adjusted. The output signals of the OP amplifier U62 are voltage-divided by resistors R619 and R620, with the result that pure ac signals are left by passing through a capacitor C615.

These signals are the ones which have been formed by summing up the active powers of the R, S and T phases. Further they pass the inverting amplifying terminal twice, i.e., through the arithmetic IC U61 and the OP amplifier U62, with the result that the phase becomes same as that of the input signals.

The 3 sets of reactive signals of R, S and T are supplied through resistors R621, R622 and R623 to an inverting input terminal (−) of an arithmetic IC U63. Further, a resistor R625 is connected between the output terminal of the arithmetic IC U63 and the inverting input terminal (−) of the arithmetic IC U63, and a connection is made from a non-inverting input terminal (+) of the arithmetic IC U63 through a resistor R624 to the ground, so that the arithmetic IC U63 would function as an adder.

Thus the output signals of the arithmetic IC U63 are supplied through a resistor R626 to an inverting input terminal (−) of an OP amplifier U64. Further, a non-inverting input terminal (+) of the OP amplifier U64 is connected through a resistor R628 to the ground, thereby stabilizing the circuit. Further, a feedback loop is formed from the output terminal of the OP amplifier U64 through resistors VR621 and R628 to the inverting input terminal (−) of the OP amplifier U64, so that the OP amplifier U64 would function as an amplifier. The amplifying level is varied in accordance with the ratio of the R626 to R628+VR621, and here, the amplifying level is adjusted by varying the VR621.

The output signals of the OP amplifier U64 are voltage-divided by resistors R629 and R630, and pass through a capacitor C625, with the result that pure ac components of signals are outputted.

These signals are the ones in which the reactive powers of R, S and T phases are added. These signals pass twice through inverting terminals, i.e., the arithmetic IC U63 and the OP amplifier U64, with the result that their phase becomes same as that of the input signals.

Figure 8:
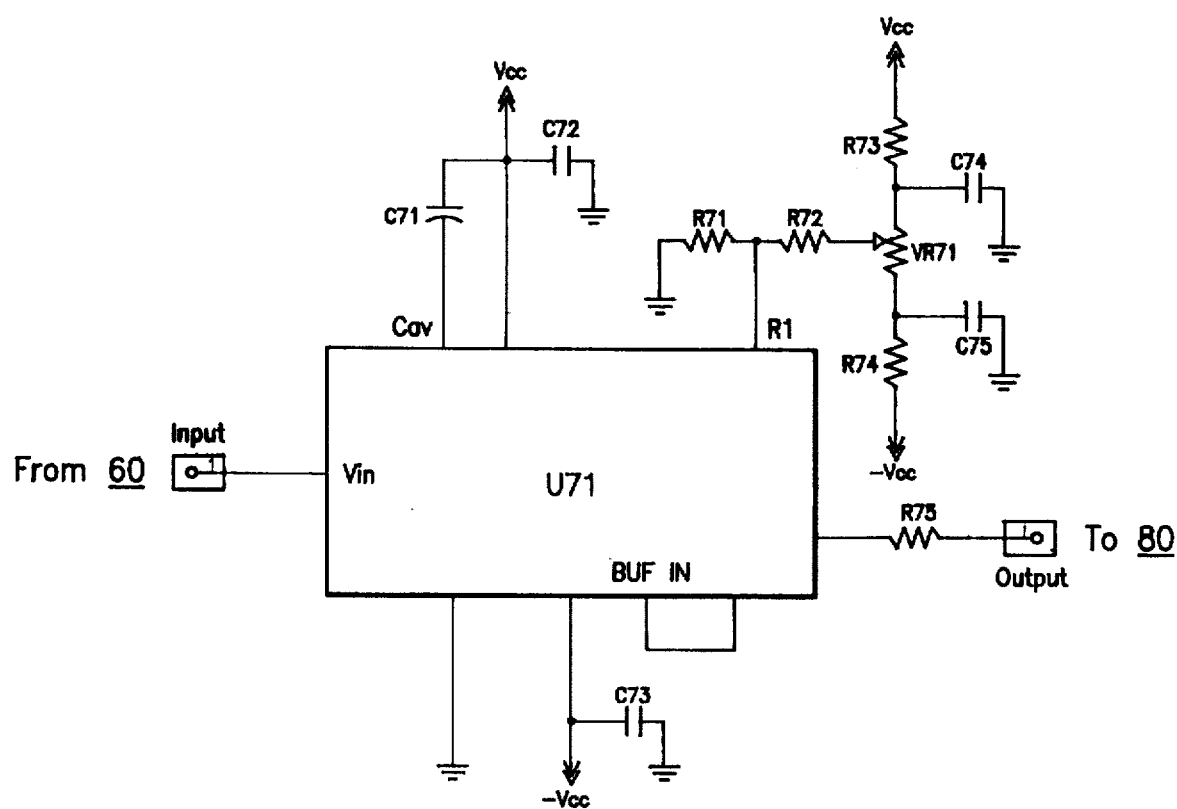
FIG. 8 illustrates a circuit for converting absolute values to effective values.

FIG. 8 illustrates an effective value converting circuit of the optical-electronic DM according to the present invention, the circuit converting the absolute values to effective values for the signals having absolute values.

This circuit is for obtaining effective values for the sinusoidal waves of active and reactive powers of the input voltage.

Signals are supplied to a terminal Vin of an arithmetic IC (AD536) U71, and capacitors are connected to a +12 V source and a terminal Cav respectively.

A voltage is supplied to a terminal RL, in such a manner that it is voltage-divided by resistors R73, VR71, R74, R71 and R72, and is adjusted by the variable resistor VR71. Thus an adjustment can be made such that the output becomes zero potential during an absence of signals.

The voltage which is supplied through the above described connections undergoes the following procedure. That is, absolute values are taken within the arithmetic IC U71, and then, they are squared and are divided by a feedback output. Then they are averaged by using a filter for the results, thereby obtaining the effective value.

Figure 9:
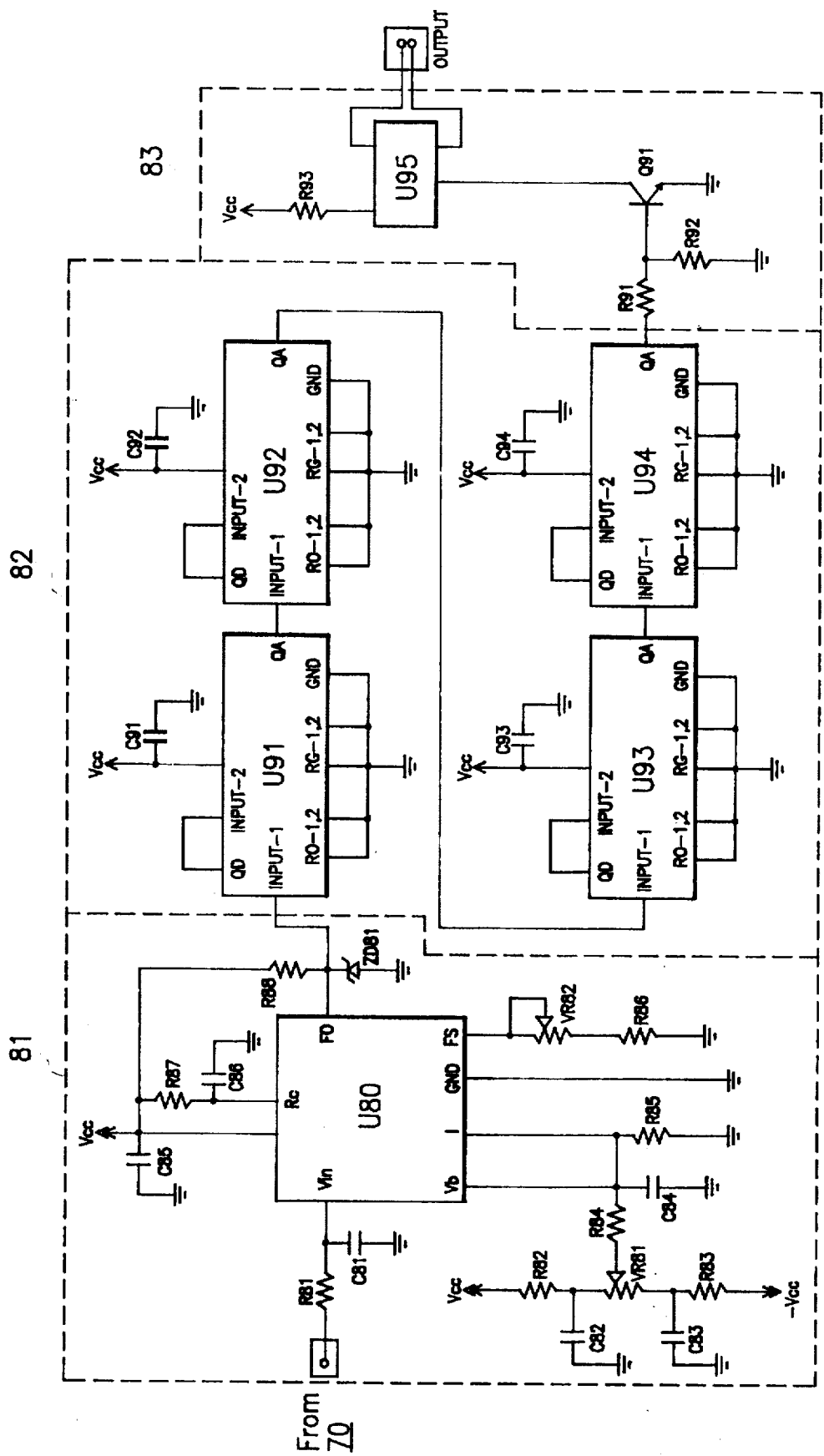
FIG. 9 illustrates a circuit for converting the voltages to frequencies.

FIG. 9 illustrates a voltage/frequency converting circuit of the optical-electronic DM according to the present invention, the circuit generating pulses of frequencies corresponding to the voltages.

The circuit of FIG. 9 includes voltage-frequency varying device 81, frequency-dividing section 82 and pulse transmitting section 83.

The voltage/frequency converting circuit 80 according to the present invention includes: a voltage-frequency varying device U80 for integrating the input signals and for voltage-comparing the integrated results with a reference value so as to convert them into signals of relevant frequencies; a frequency-dividing section for subjecting the output signals of the voltage-frequency varying device U80 to a multi-step frequency division so as to make the frequency-divided signals have a certain frequency; and a pulse transmitting section for electrically insulating the output pulse signals of the frequency-dividing section so as to send them to the integrating section and to the display circuit.

First, the input signals are integrated by a resistor R81 and a capacitor C81, and are supplied to a terminal Vin of the voltage-frequency varying device (LM 331) U80. Further, the +12 V source is voltage-divided by resistors R82, VR81, R83, R84 and R85, and is stabilized by capacitors C82, C83 and C84. Further, it is adjusted by the variable resistor VR81 so as to be supplied as a reference voltage to a terminal Vb.

Therefore, the voltage-frequency varying device U80 compares the positive voltage of the terminal Vin with the reference voltage of the terminal Vb so as to output frequency signals proportionally to the input voltage of the terminal Vin.

The frequency thus obtained becomes such that the pulse height becomes 5 V by a resistor R88 and a zener diode ZD81. Further it is frequency-divided by U91, U92, U93 and U94, thereby giving the final pulse output.

In order to electrically insulate the pulses from the integrated values, the pulses are voltage-divided, and then, are supplied to the base of a transistor Q91. Meanwhile, a potential of +5 V passes through a resistor R93, an LED anode of a photo-coupler U95, its cathode, the collector of the transistor Q91 and its emitter to arrive to the ground. Thus in accordance with the pulses, the LED of the photo-coupler U95 blinks.

Thus a photo transistor which is a light receiving device of the photo-coupler U95 is energized, with the result that an insulated pulse output is outputted.

Figure 10:
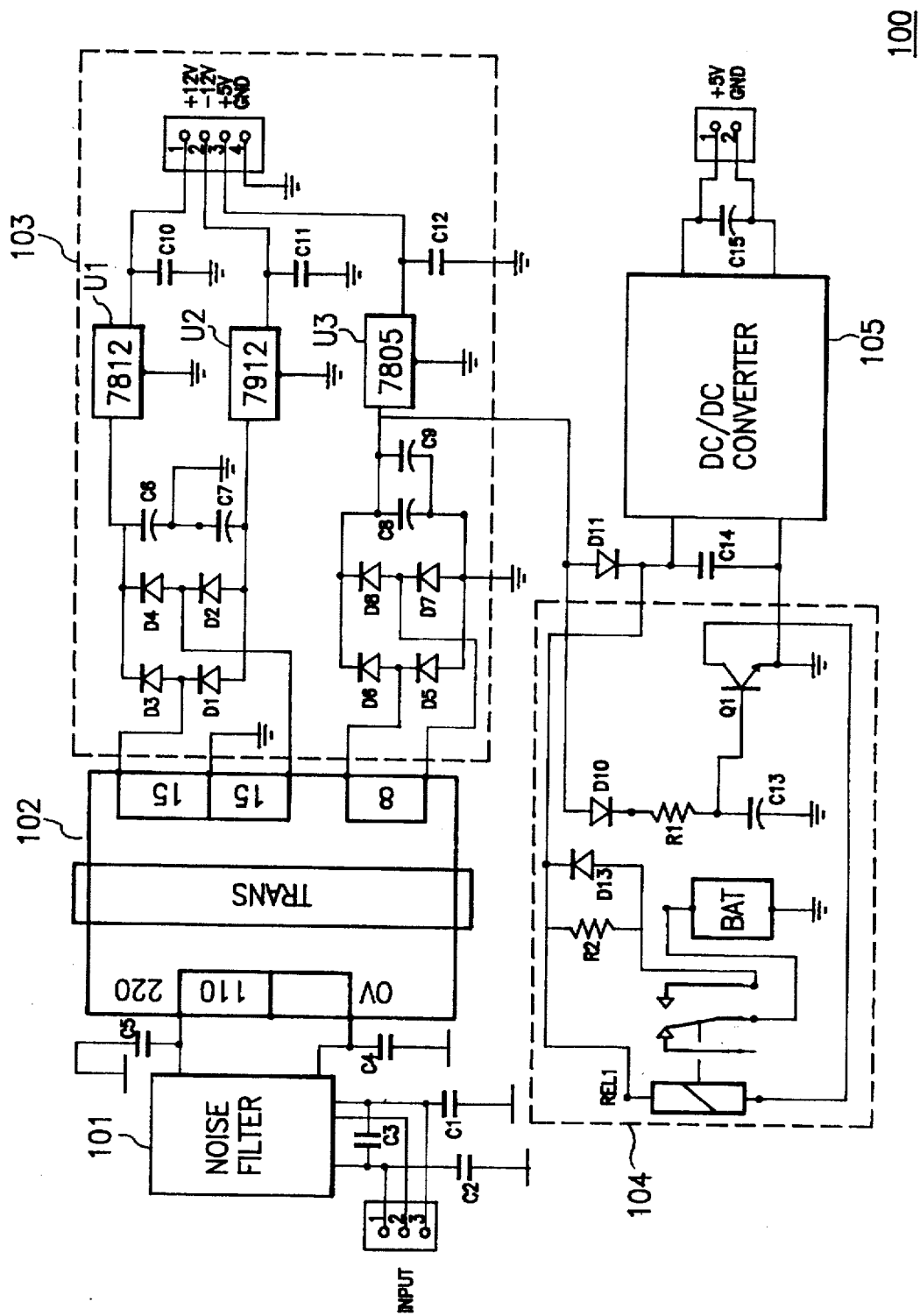
FIG. 10 illustrates a power source circuit.

FIG. 10 illustrates a power supply circuit of the optical-electronic DM according to the present invention, the circuit supplying the power to the respective circuits.

As shown in FIG. 10, the power supply circuit 100 supplies power to the respective components, and includes: a storage battery for supplying the power for several seconds during a power failure; and a charge/discharge auxiliary circuit for managing the storage battery.

When power is supplied to an input terminal, harmonics are removed by capacitors C1 and C2 which are grounded. Further, spike noises and an over-voltage are eliminated by a capacitor C3, and various power source noises are removed by a noise filter 101.

The power which has been filtered by the noise filter 101 is stepped down to a 13 V full wave and to 6 V.

The stepped-down powers are full-wave-rectified by diodes D1–D4 and D5–D8, and are stabilized by capacitors C6, C7 C8 and C9 so as to become a pulsating current similar to a dc current.

Then they become the stabilized dc power sources of +12 V, −12 V and +5 V by regulators U1, U2 and U3. The dc power sources are stabilized again by capacitors C10, C11 and C12, and are protected from the parasitic oscillations of the regulators U1, U2 and U3.

These power sources of +12 V, −12 V and +5 V are supplied to the respective internal circuits which require stabilized power sources respectively.

The power source +5 V is supplied through a diode D11 to a dc/dc convertor 105 so as to be further stabilized, and then, is supplied to the integrating and displaying circuit 90.

Meanwhile, a backup battery section 104 receives the stabilized +5 V power to monitor the power failure, and to make the power of the storage battery BAT supplied to the dc/dc converter 105 during a power failure.

The backup battery section 104 is charged by a resistor R1 and a capacitor C13 after the stabilized power +5 V has passed through a diode D10. The charged power is supplied to the base of a transistor Q1. A relay REL1 is controlled by the transistor Q1, and through the contact of the relay REL1, the power of the battery BAT is supplied through a diode D13 to the dc/dc converter 105.

Thus the level which has been charged into the capacitor C13 turns on the transistor Q1 so as to turn on the relay REL1. Through the contact of the relay, the power of the battery BAT is supplied to the dc/dc converter 105. The battery BAT is charged by a limited current through a resistor R2 at the normal times.

Thus the transistor Q1 is turned on by the level which has been charged through the resistor R1 into the capacitor C13, and therefore, the relay REL1 is maintained turned on during a power failure, so that the power of the battery BAT would be supplied to the dc/dc converter 105. Consequently, the power which is supplied to the integrating circuit 100 is maintained for several seconds. Therefore, the integrating and displaying circuit 90 can store the arithmetic data up to the present during a power failure.

According to the present invention as described above, the optical MOF detects the current and voltage, and is connected to the DM. Therefore, a separate insulating device is not required, and is immune from the influence of the line noises, with the result that reliable arithmetic and integration can be carried out.

What is claimed is:

1. An optical-electronic demand meter, comprising:

a light emitting device driving circuit for driving a light emitting device, said light emitting device sending light rays through an optical fiber to an optical metering outfit (MOF);

a light receiving device and a light receiving circuit for receiving optical voltage and current signals as modulated optical signals roms said MOF through an optical fiber to convert said optical signals into electrical signals;

a zero point adjusting circuit for adjusting the converted electrical voltage and current signals of said light receiving circuit to make the central point of the signal positioned at an electrical zero point;

a multiplying circuit for multiplying the output voltage and current signals of said zero point adjusting circuit to form power signals;

an active/reactive power separating circuit for separating the power signals of said multiplying circuit into active power signals and reactive power signals;

a power summing circuit for summing the active and the reactive power of said active/reactive power separating circuit for respective phases;

an effective value converting circuit for converting the absolute values of the active power and the reactive power of said power summing circuit into effective values;

a voltage/frequency converting circuit for generating pulses of frequencies corresponding to the output of said effective value converting circuit;

an integrating and displaying circuit for calculating and integrating the pulse signals of said voltage/frequency converting circuit, and for storing and displaying the integrated data; and a power source circuit for supplying power to the above mentioned circuits, and including a battery backup circuit for ensuing operation time for storing the data during a power failure.

2. The optical-electronic demand meter as claimed in claim 1, wherein said light emitting device and its driving circuit comprise a total of 6 optical sources and driving circuits consisting of 3 for the voltage and 3 for the current; and said light receiving device and its driving circuit also comprise a total of 6 light receiving devices and driving circuits consisting of 3 for the voltage and 3 for the current.

3. The optical-electronic demand meter as claimed in claim 1, wherein said automatic zero point adjusting circuit comprises:

a pre-amplifying section for amplifying the output signals of said light receiving circuit;

a filter for stabilizing the amplified signals, and for removing harmonic noises;

a dc signal detecting section for detecting dc components by integrating the signals of said filter;

an ac signal detecting section for removing dc components and for detecting only ac components by differentiating signals of the filter;

a zero point arithmetic IC for obtaining ac signals always alternating across the zero potential regardless of the magnitude of the dc component by dividing dc components into ac components; and an amplifying and outputting section for amplifying and filtering the output signals of said zero point arithmetic IC before outputting them.

4. The optical-electronic demand meter as claimed in claim 3, wherein said active/reactive power separating circuit comprises:

an active power separating section for separating the signals biased to the positive side across the zero point after receipt of signal waves from said arithmetic IC; and a reactive power separating section for separating the signals biased to the negative side across the zero point after receipt of signal waves from said arithmetic circuit, said two sections forming one set of sections for outputting alternating signal waves across the zero potential, and wherein said active/reactive power separating circuit comprises 3 sets of said sections.

5. The optical-electronic demand meter as claimed in claim 1, wherein said voltage/frequency converting circuit comprises:

a voltage-frequency varying device for converting input signals into frequency signals by integrating input signals and comparing the integrated results with a reference value;

a frequency demultiplier for dividing output signals of said voltage-frequency varying device; and a pulse transmitting section for electrically insulating output pulse signals and for transmitting said pulse signals to said voltage-frequency varying device and to said display circuit.

6. An optical-electronic demand meter, comprising:

an optical source for generating light;

a metering outfit (MOF) having an optical current transformer (CT) and an optical Potential transformer (PT) for receiving light and outputting a modulated light through said optical CT and the optical PT;

a light receiving means for receiving the modulated light through optical fibers and converting said modulated light into electrical current and voltage signals;

a signal processing means for calculating power amounts from said current and voltage signals to obtain active and reactive power factors;

an integrating and displaying means for integrating and displaying the calculated power amount for each time interval, and for calculating, processing, storing and displaying the power demand for each set period, the power data being stored in an EEPROM; and a power supply means having an auxiliary battery for supplying power to store the data within a certain period of time during a power failure.

* * * * *